(12) United States Patent
Park

(10) Patent No.: US 8,835,744 B2
(45) Date of Patent: Sep. 16, 2014

(54) SOLAR CELL MODULE

(71) Applicant: LG Electronics Inc., Seoul (KR)

(72) Inventor: Sanghwan Park, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 14/082,486

(22) Filed: Nov. 18, 2013

(65) Prior Publication Data

US 2014/0076375 A1    Mar. 20, 2014

Related U.S. Application Data

(63) Continuation of application No. 12/917,815, filed on Nov. 2, 2010, now Pat. No. 8,586,855.

(30) Foreign Application Priority Data

May 17, 2010 (KR) .......................... 10-2010-0045876

(51) Int. Cl.
    *H01L 31/05*      (2014.01)
    *H01L 31/0216*      (2014.01)
    *H01L 31/02*      (2006.01)
    *H01L 31/048*      (2014.01)

(52) U.S. Cl.
    CPC .......... *H01L 31/05* (2013.01); *H01L 31/02168* (2013.01); *H01L 31/0504* (2013.01); *Y02E 10/50* (2013.01); *H01L 31/02013* (2013.01); *H01L 31/0485* (2013.01); *Y10S 136/293* (2013.01); *Y10S 136/291* (2013.01)
    USPC .......... 136/244; 136/251; 136/293; 136/291; 52/173.3; 52/173.1; 52/748.1; 439/535

(58) Field of Classification Search
    USPC ................ 136/244, 251, 293, 291; 52/173.3, 52/173.1, 748.1; 439/535
    See application file for complete search history.

(56) References Cited

U.S. PATENT DOCUMENTS

| | | | |
|---|---|---|---|
| 4,040,867 | A | 8/1977 | Forestieri et al. |
| 4,321,416 | A | 3/1982 | Tennant |
| 5,990,414 | A | 11/1999 | Posnansky |
| 6,245,987 | B1 | 6/2001 | Shiomi et al. |
| 6,311,436 | B1 | 11/2001 | Mimura et al. |

(Continued)

FOREIGN PATENT DOCUMENTS

| | | |
|---|---|---|
| CN | 1202561 A | 12/1998 |
| DE | 202006017963 U1 | 8/2007 |

(Continued)

OTHER PUBLICATIONS

European Search Report dated Feb. 12, 2014 for Application No. EP 10014676, 6 pages.

(Continued)

*Primary Examiner* — Golam Mowla

(74) *Attorney, Agent, or Firm* — Fish & Richardson P.C.

(57) ABSTRACT

A solar cell module having a solar cell panel with strings of electrically-coupled solar cells arranged in a row includes one or more lead wires that electrically couple the strings and a junction box. The one or more lead wires are arranged such that they do not overlap with each other and such that one or more of the lead wires includes a portion that overlaps and does not electrically connect to interconnector of a string. The lead wires include an interconnector connection part connected to a respective string interconnector, and the interconnector connection parts of the lead wires are arranged in a straight line.

20 Claims, 6 Drawing Sheets

(56) References Cited

U.S. PATENT DOCUMENTS

| | | |
|---|---|---|
| 6,369,315 B1 | 4/2002 | Mizukami |
| 7,854,095 B2 | 12/2010 | Banister |
| 8,209,920 B2 | 7/2012 | Krause et al. |
| 2001/0050102 A1 | 12/2001 | Matsumi et al. |
| 2008/0083453 A1 | 4/2008 | Rose et al. |
| 2008/0196757 A1 | 8/2008 | Yoshimine |

FOREIGN PATENT DOCUMENTS

| | | |
|---|---|---|
| EP | 0 884 432 A2 | 12/1998 |
| EP | 1 041 647 A1 | 10/2000 |
| EP | 1 928 027 A2 | 6/2008 |
| JP | 2000-101122 A | 4/2000 |
| JP | 2004-140024 A | 5/2004 |
| JP | 2005-248671 A | 9/2005 |
| KR | 2006-0105535 A | 10/2006 |
| KR | 2007-0062516 A | 6/2007 |
| KR | 2008-0100373 A | 11/2008 |
| WO | WO 2008/042194 A2 | 4/2008 |

OTHER PUBLICATIONS

Chinese Office Action dated Mar. 4, 2013 for Application No. 201010565334.5, with English Translation, 18 pages.

SOLAR CELL MODULE

CROSS-REFERENCE TO RELATED APPLICATIONS

This application is a continuation of U.S. application Ser. No. 12/917,815, filed Nov. 2, 2010, now allowed, which claims priority under 35 U.S.C. §119(a) to Patent Application No. 10-2010-0045876 filed in the Republic of Korea on May, 17, 2010, the entire contents of which are hereby incorporated by reference.

BACKGROUND

1. Field

This document relates to a solar cell module having a plurality of solar cells.

2. Related Art

Recently, as the exhaustion of various existing energy resources, such as oil or coal, is foreseen, an interest in their replacement with alternative energy sources is increasing. Of these alternative energy sources, solar cells receive much attention.

A solar cell converts solar energy into electric energy using a photoelectric transformation effect. One solar cell produces a small amount of power, usually a few volts. Thus, in order to obtain a greater output, a solar cell module can be configured by connecting several solar cells in series or in parallel. Waterproofing is used to protect the solar cells of the module.

In such a solar cell module, conductors (e.g., inter-connectors) connected with positive electrodes and negative electrodes of the solar cells are connected to one or more lead wires to output power generated by the solar cell module. The lead wires are connected with a junction box to output power through a power line of the junction box.

In a solar cell module having such a configuration, the lead wire is disposed in an additional area outside of an area in which the solar cells are located in a solar cell panel. The additional area, which is required for the lead wire, does not contribute to power generation. Thus, the additional portion causes an increase in the size of the solar cell panel and an associated increase in the size of the solar cell module.

SUMMARY

In one aspect, there is a solar cell module including a solar cell panel. The solar cell panel includes an array of solar cells defining a plurality of strings. Each of the plurality of strings includes a plurality of solar cells in electrical connection and arranged in a row. The solar cell module further includes a plurality of interconnectors electrically connecting the plurality of solar cells of the strings. The solar cell module also includes a junction box that receives electric current generated from the plurality of strings. The solar cell module includes a plurality of lead wires electrically coupling the junction box to an end portion of the interconnectors. The plurality of lead wires are arranged such that they do not overlap with each other.

Implementations may include one or more of the following features. For example, the plurality of strings may include two outer strings positioned closest to two outer edges of the solar cell panel and one or more inner strings positioned between the outer strings. Each of the plurality of interconnectors may include an interconnector connection part connected to the interconnector of a respective string. The interconnector connection parts of the respective lead wires may be arranged in a straight line.

A lead wire of the plurality of lead wires that is connected to the interconnector of an outer string may include a junction box connection part coupled to the junction box and a coupling part coupled to the interconnector connection part and the junction box connection part. The junction box connection part and the interconnector connection part of the lead wire of the plurality of lead wires that is connected to the interconnector of the outer string may be arranged orthogonal to each other.

The coupling part of the lead wire of the plurality of lead wires that is connected to the interconnector of the outer string may include a first coupling part coupled to the interconnector connection part such that the first coupling part is orthogonal to and intersects the interconnector connection part. The coupling part of the lead wire of the plurality of lead wires that is connected to the interconnector of the outer string may include a second coupling part coupled to the first coupling part and the junction box connection part, the second coupling part being arranged parallel to the interconnector connection part.

The interconnector connection part, the first coupling part, the second coupling part, and the junction box connection part of the lead wire of the plurality of lead wires that is connected to the interconnector of the outer string may be integrally formed.

A lead wire of the plurality of lead wires that is coupled to an interconnector of an inner string may include a junction box connection part coupled to the junction box and the interconnector connection part of the lead wire of the plurality of lead wires that is coupled to the interconnector of the inner string, such that the junction box connection part is orthogonal to the interconnector connection part.

The solar cell module may include an insulating film for insulating the plurality of lead wires from the interconnectors and the solar cells.

At least one of the plurality of interconnectors may be arranged to traverse atop at least one solar cell of the array of solar cells.

In another aspect, there is a lead wire structure installed within a solar cell module. The lead wire structure includes a plurality of lead wires. Each of the plurality of lead wires includes an interconnector connection part configured to be connected to an interconnector. The interconnector electrically couples a plurality of solar cells of the solar cell module. Each of the plurality of lead wires also includes a junction box connection part configured to be connected to a junction box of a solar cell module. The plurality of lead wires are arranged such that they do not overlap with each other when connected to the interconnectors and the junction box.

In another aspect, there is a solar cell module including an array of solar cells defining a plane and having a width and length defined by constituent peripheral cells of the array. The solar cell module further includes a plurality of interconnectors. Each of the plurality of interconnectors electrically couples a row of solar cells of the array extending in a lengthwise direction. The solar cell module also includes a plurality of leads. Each of the plurality of leads is electrically coupled to a respective interconnector of the plurality of interconnectors. A portion of at least one of the plurality of leads extends in a widthwise direction and overlaps at least one solar cell of the array. The solar cell module also includes a junction box physically coupled to each of the plurality of the leads and electrically coupled to each of the plurality of interconnectors through the leads. The solar cell module also includes an insulating layer insulating the plurality of leads wires from the solar cells and the plurality of interconnectors.

Implementations may include one or more of the following features. For example, the insulation layer may be positioned between the array of solar cells and the plurality of leads.

The insulation layer may be positioned to obscure a view of an entire portion of the plurality of leads traversing in the lengthwise direction when viewed from a front side of the solar cell module, the front side being a side upon which light is incident for energy generation.

The solar cell module may include a back sheet that protects a surface of the solar cell module opposite a surface upon which light is incident. The plurality of leads may be printed on the back sheet. The insulation layer may be opaque.

At least one portion of a lead of the plurality of leads may be located beyond a periphery of the insulating layer. The portion of the lead may connect with an interconnector.

According to the foregoing features, because the interconnector connection part of the outer lead wire and the interconnector of the inner lead wire are disposed in series, an invalid area can be reduced compared with a case in which interconnector connection parts are disposed in parallel.

DETAILED DESCRIPTION

Figure 1:
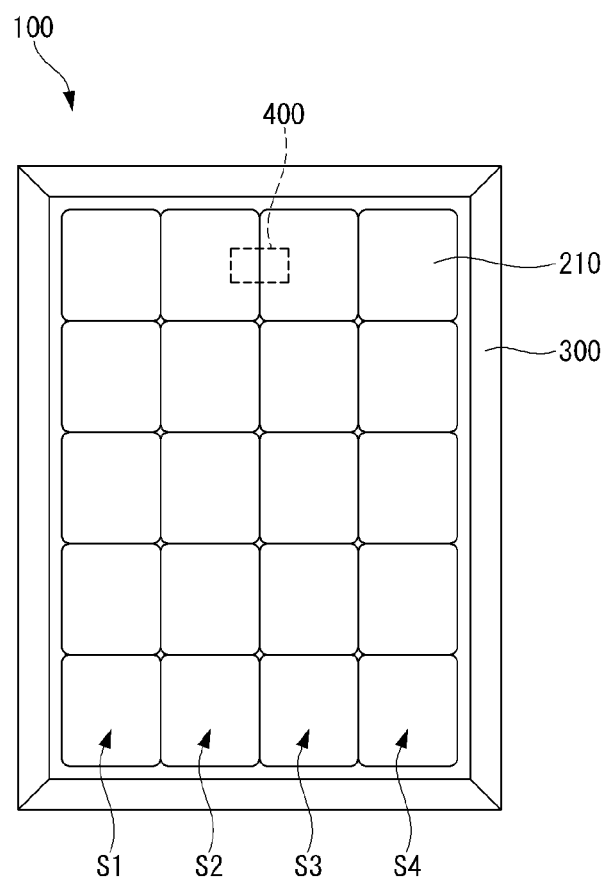
FIG. 1 is a front view of a solar cell module.

Implementations will now be described in detail with reference to the drawings. In the drawings, the shapes and dimensions may be exaggerated for clarity, and the same reference numerals will be used throughout to designate the same or like components. For clarity, the thicknesses of the layers may be enlarged in the drawings. Additionally, when any part, such as a layer, film, area, or plate, is described as being positioned on another part, such description means the part is directly on the other part or above the other part with at least one intermediate or intervening part. On the other hand, if any part is described as being positioned directly on another part, such description means that there is no intermediate or intervening part between the two parts.

Figure 2:
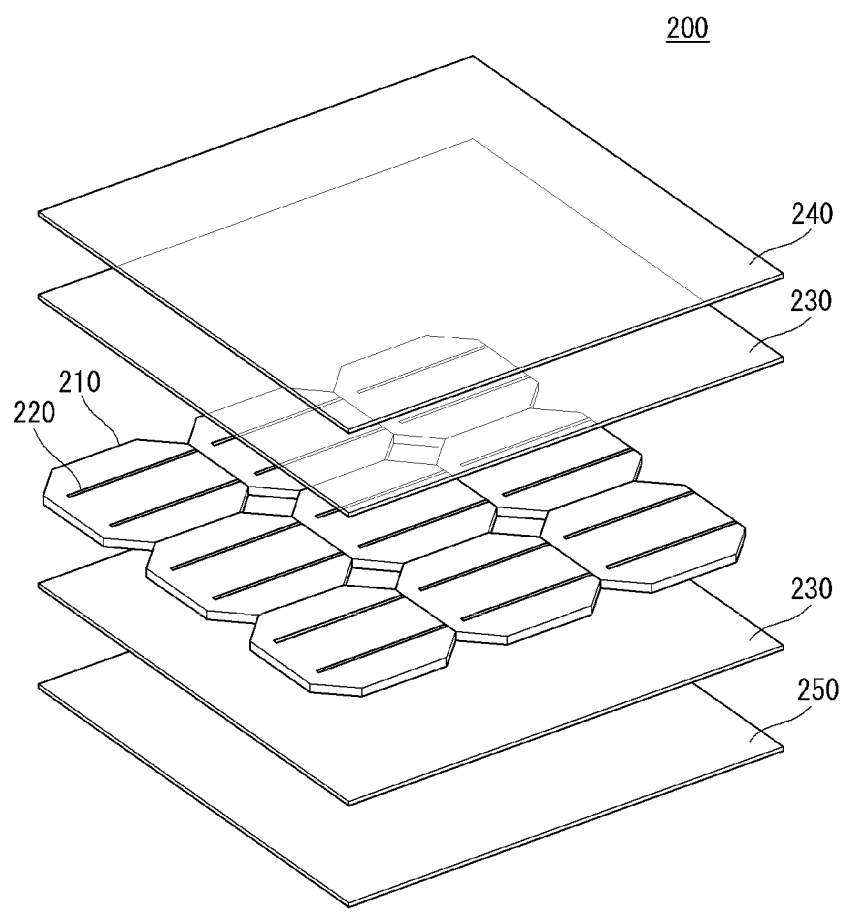
FIG. 2 is an exploded perspective view of the solar cell panel illustrated in FIG. 1.
Figure 3:
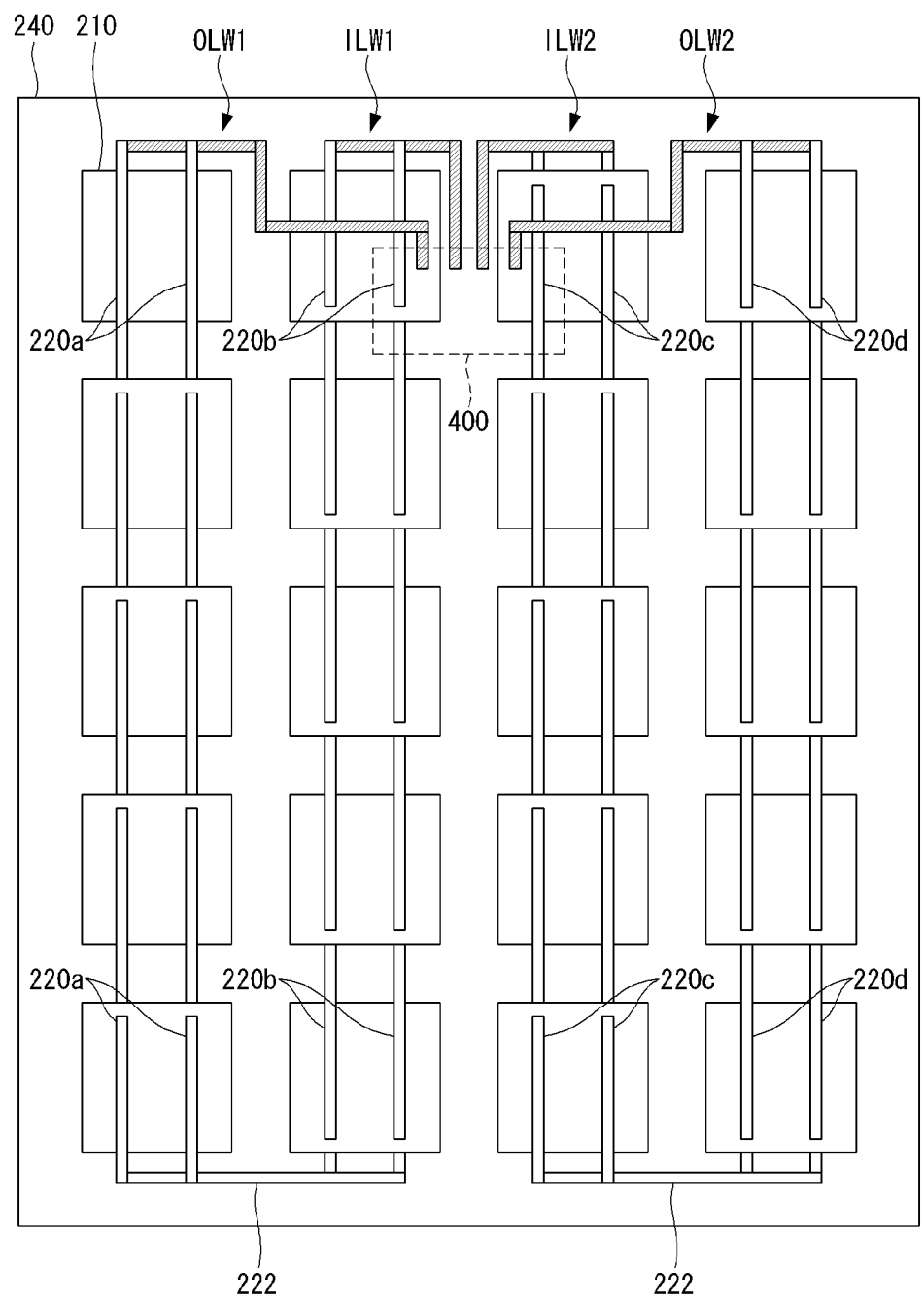
FIG. 3 is a rear view of the solar cell panel illustrated in FIG. 1.

FIG. 1 is a front view of a solar cell module, FIG. 2 is an exploded perspective view of the solar cell panel illustrated in FIG. 1, and FIG. 3 is a rear view of the solar cell panel illustrated in FIG. 1.

Figure 4:
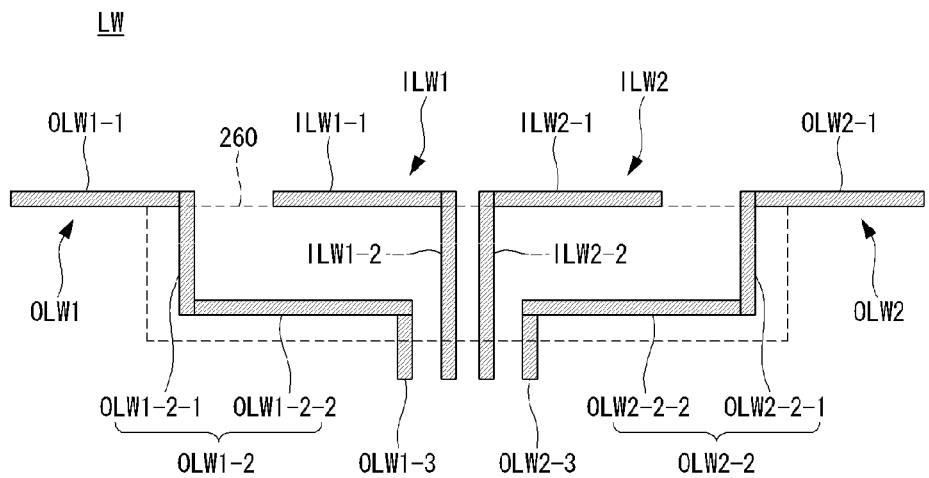
FIG. 4 is an enlarged view of a design of lead wires of the solar cell panel.
Figure 5:
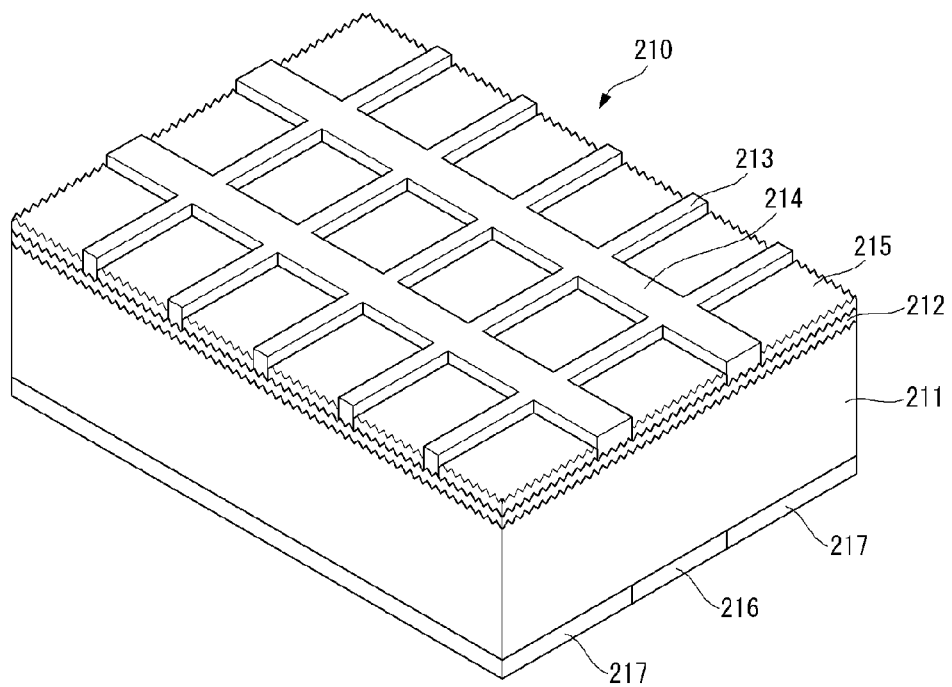
FIG. 5 is a perspective view of a portion of the solar cell illustrated in FIG. 1.

FIG. 4 is an enlarged view of a configuration of lead wires of the solar cell panel, and FIG. 5 is a perspective view of a portion of the solar cell illustrated in FIG. 1.

With reference to FIGS. 1-5, a solar cell module 100 includes a solar cell panel 200. The solar cell panel 200 includes a plurality of solar cells 210, interconnectors 220 that electrically couple the neighboring solar cells 210, protection layers (e.g., EVA: Ethylene Vinyl Acetate) 230 protecting the solar cells 210, a transparent member 240 disposed on the protection layer 230 on a side of a light receiving surface of the solar cells 210, and a back sheet 250 made of an opaque material and disposed at a lower side of the protection layer 230, which is opposite of the light receiving surface of the solar cells 210.

The solar cell module 100 also includes a frame 300 for receiving the components integrated through a lamination process and a junction box 400 for collecting power generated by the solar cells 210.

The back sheet 250 prevents moisture from infiltrating through the rear surface of the solar cell module 100, thus protecting the solar cells 210 against an external environment. The back sheet 250 may have a multi-layered structure that includes a layer for preventing moisture and oxygen infiltration, a layer for preventing chemical corrosion, and a layer having electrical insulating characteristics.

The protection layers 230, when disposed at the upper and lower sides of the solar cells 210, are integrated with the solar cells 210 through a lamination process. The protection layers 230 serve to prevent corrosion that can be caused by moisture infiltration and protect the solar cells 210 against damage caused by impact forces. The protection layers 230 may be made of a polymeric insulating material, such as Ethylene Vinyl Acetate (EVA).

The transparent member 240 positioned on the protection layer 230 is made of tempered glass having a high transmittance and excellent anti-damage function. In this case, the tempered glass may be low iron tempered glass having a low iron content. An inner surface of the transparent member 240 may be subjected to an embossing process in order to enhance a light diffusion effect of the transparent member 240.

As shown in FIG. 5, the solar cells 210 of the solar cell panel 200 include a substrate 211 and an emitter part 212 positioned on a light receiving surface of the substrate 211 onto which light is incident. First electrodes 213 are included on the emitter part 212, and at least one first collector 214 is included on the emitter part 212. An anti-reflection layer 215 is included on regions of the emitter part 212 where the first electrodes 213 and the first collector 214 are not located, and a second electrode 216 and second collectors 217 are included on the opposite side of the light receiving surface.

The solar cell 210 may further include a back surface field (BSF) part formed between the second electrode 216 and the substrate 211. The BSF part is a region, heavily doped with the same conductive type impurities as that of the substrate 211, such as a p+ region.

The BSF part serves as a potential barrier at the back surface of the substrate 211. Thus, the phenomenon by which electrons and holes re-combine and become extinct at the back surface of the substrate 211 can be reduced, and thus, the efficiency of the solar cells 210 can be improved.

The substrate 211 is a semiconductor substrate made of silicon of a first conductive type, (e.g., p-type conductive type silicon). In this case, the silicon may be, for example, monocrystalline silicon, polycrystalline silicon, or amorphous silicon. When the substrate 211 has a p-type conductive type, it may contain impurities of a trivalent element such as boron (B), gallium (Ga), indium (In), or the like.

The substrate 211 is processed in order to make the surface of the substrate 211 a textured surface. Because the surface of the substrate 211 is texturized, a light reflectivity at the light receiving surface of the substrate 211 can be reduced. Moreover, the textured surface of the substrate 211 operates to direct reflected light into the interior of the solar cells, increasing a light absorption rate. Accordingly, the efficiency of the solar cells can be improved.

The emitter part 212 is an area where second conductive type, which is opposite to the conductive type of the substrate 211 (e.g., n-type conductive type), impurities are doped. The emitter part 212 forms a p-n junction with the substrate 211. When the emitter part 212 is of the n-type conductive type, the emitter part 212 may be formed by doping impurities of a group 5 element such as phosphor (P), arsenic (As), antimony (Sb), or the like.

Accordingly, when electrons in the interior of the semiconductor receive energy from light incident on the substrate 211, the electrons migrate toward an n-type semiconductor, while holes migrate toward a p-type semiconductor. Thus, when the substrate 211 is a p-type semiconductor while the emitter part 212 is an n-type semiconductor, the separated holes migrate toward the substrate 211 and the separated electrons migrate toward the emitter part 212.

Conversely, the substrate 211 may be an n-type conductive type and made of a semiconductor material other than silicon. When the substrate 211 has the n-type conductive type, the substrate 211 may contain impurities of a group 5 element such as phosphor (P), arsenic (As), antimony (Sb), and the like.

Because the emitter part 212 forms the p-n function with the substrate 211, when the substrate 211 has the n-type conductive type, the emitter part 212 has a p-type conductive type. In this case, the separated electrons transfer toward the substrate 211 and the separated holes transfer toward the emitter part 212.

When the emitter part 212 has the p-type conductive type, the emitter part 212 may be formed by doping impurities of a trivalent element such as boron (B), gallium (Ga), indium (In), and the like, on the substrate 211.

The anti-reflection layer 215 may be formed of a silicon nitride film (SiNx), a silicon oxide film (SiO2), or the like, and is positioned on the emitter part 212 of the substrate 211. The anti-reflection layer 215 serves to reduce the portion of light incident on the solar cell 210 that is reflected and increases selectivity of a particular wavelength region, thus enhancing the efficiency of the solar cell 210. The anti-reflection layer 215 may have a thickness ranging from 70 nm to 80 nm, or may be omitted as necessary.

The plurality of first electrodes 213 are positioned on the emitter part 212 and electrically coupled to the emitter part 212. The plurality of first electrodes 213 are positioned in one direction and are separated from each other. The first electrodes 213 collect charge carriers (e.g., electrons) that have migrated toward the emitter part 212 and conduct the collected electrons to the corresponding first collector 214.

The plurality of first electrodes 213 may be made of at least one conductive material, and the conductive material may be at least one material selected from the group consisting of nickel (Ni), copper (Cu), silver (Ag), tin (Sn), zinc (Zn), indium (In), titanium (Ti), gold (Au), and any of their combinations or alloys, or also may be made of any other conductive metal material.

The plurality of first collectors 214 are positioned on the emitter part 212 and are referred to as a bus bar. The first collectors 214 are positioned to cross the first electrodes 213. Accordingly, the first electrodes 213 and the first collectors 214 are disposed to cross each other on the emitter part 212.

The first collectors 214 may be made of at least one conductive material and coupled to the emitter part 212 and to the first electrodes 213. Accordingly, the first collectors 214 output carriers, e.g., electrons, conducted by the first electrodes 213 to an external device.

A conductive metal material of the first collectors 214 may be at least one material selected from the group consisting of nickel (Ni), copper (Cu), silver (Ag), tin (Sn), zinc (Zn), indium (In), titanium (Ti), gold (Au), and any combination or alloy of these, or also may be made of any other conductive metal material. Moreover, the plurality of first collectors 214 may contain the same material as that of the first electrodes 213, but may also contain a different material.

The first electrodes 213 and the first collectors 214 may be formed by coating a conductive metal material on the anti-reflection layer 215, patterning the conductive metal material. The conductive metal material can then be baked. During this forming process, the first electrodes 213 and the first collectors 214 may be electrically coupled to the emitter part 212 according to a punch-through operation. Alternatively, the first electrodes 213 and the first collectors 214 may be formed separately and/or through different processes.

The second electrode 216 is positioned on the side opposite of the light receiving surface of the substrate 211, namely, on the back surface of the substrate 211, and collects carriers (e.g., holes) migrating toward the substrate 211.

The second electrode 216 is made of at least one conductive material. The conductive material may be at least one material selected from the group consisting of nickel (Ni), copper (Cu), silver (Ag), tin (Sn), zinc (Zn), indium (In), titanium (Ti), gold (Au), and any of their combinations or alloys, or also may be made of any other conductive metal material.

A plurality of second collectors 217 are positioned under the second electrode 216 or on the same surface on which the second electrode 216 is formed. The second collectors 217 cross the first electrodes 213, and the second collectors 217 can be parallel to the first collectors 214.

The second collectors 217 are made of at least one conductive material and are electrically coupled to the second electrode 216. Accordingly, the second collectors 217 output carriers (e.g., holes) conducted from the second electrode 216 to an external device or another conductor.

A conductive metal material of the second collectors 217 may be at least one material selected from the group consisting of nickel (Ni), copper (Cu), silver (Ag), tin (Sn), zinc (Zn), indium (In), titanium (Ti), gold (Au), and any of their combinations or alloys, or may be made of any other conductive metal material.

An electrical connection structure of the solar cell panel will be described in detail with reference to FIGS. 2 to 4. In FIG. 3, spaces between the solar cells 210 are magnified for illustrative purposes, but substantially, the neighboring solar cells 210 are disposed at certain intervals (e.g., at narrow intervals of 3 mm or smaller), as shown in FIG. 1.

The plurality of solar cells 210 provided in the solar cell panel 200 are arranged in the form of a plurality of "strings." Here, the "strings" refer to a plurality of solar cells arranged in a row and electrically connected with each other in series. Accordingly, the solar cell module 200 illustrated in FIGS. 1 to 3 has four strings, e.g., first to fourth strings S1, S2, S3, and S4. As shown, the strings are arranged in a lengthwise direction and are arranged next to adjacent strings, side-by-side in a widthwise direction. Hereinafter the first and fourth strings S1 and S4 positioned at the corners of the solar cell panel 200 will be referred to as outer strings, and the second and third strings S2 and S3 positioned between the outer strings S1 and S4 will be referred to as inner strings.

The plurality of solar cells 210 arranged at the respective strings S1 to S4 are electrically coupled by interconnectors 220. In detail, the first collectors (214 in FIG. 5) of one solar cell among the plurality of solar cells disposed to be adjacent to each other in a vertical direction within one string (e.g., the first string S1) are electrically coupled with the second collectors (217 in FIG. 5) of the neighboring solar cell by interconnectors 220a.

The interconnectors 220a positioned at one end portion of the first string S1 are connected with interconnectors 220b positioned at one end portion of the second string S2 by interconnectors 222. Similarly, interconnectors 220c positioned at one end portion of the third string S3 are connected with the interconnectors 220d positioned at one end portion of the fourth string S4 by the interconnectors 222.

Lead wires (LW) for transferring power generated from the solar cells 210 to the junction box 400 are coupled to the interconnectors 220a, 220b, 220c, and 220d positioned at the other end portions of the strings S1 to S4.

In the following description, lead wires coupled to the interconnectors 220a and 220d of the outer strings, namely, the first and fourth strings S1 and S4, will be referred to as outer lead wires (OLW), and lead wires coupled to the interconnectors 220b and 220c of the inner strings, namely, the second and third strings S2 and S3, will be referred to as inner lead wires (ILW).

The lead wire coupled to the interconnectors 220a of the first string S1 will be referred to as a first outer lead wire OLW1, the lead wire coupled to the interconnectors 220d of the fourth string S4 will be referred to as a second outer lead wire OLW2, the lead wire coupled to the interconnectors 220b of the second string S2 will be referred to as a first inner lead wire ILW1, and the lead wire coupled to the interconnectors 220c of the third string S3 will be referred to as a second inner lead wire ILW2.

Of particular note, the first outer lead wire OLW1 and the second outer lead wire OLW2 do not overlap with the first inner lead wire ILW1 and the second inner lead wire ILW2. Thus, there is no electrical connection or other interaction or interference between the outer lead wires OLW1 and OLW2 and the inner lead wires ILW1 and ILW2.

In more detail and as shown in FIG. 5, the first outer lead wire OLW1 includes an interconnector connection part OLW1-1 connected to the interconnector 220a, a coupling part OLW1-2 connected to one end portion of the interconnector connection part OLW1-1, and a junction box connection part OLW1-3 connected to the other end portion of the coupling part OLW1-2. Likewise, the second outer lead wire OLW2 includes an interconnector connection part OLW2-1 connected to the interconnector 220d, a coupling part OLW2-2 connected to one end portion of the interconnector connection part OLW2-1, and a junction box connection part OLW2-3 connected to the other end portion of the coupling part OLW2-2.

The first inner lead wire ILW1 includes an interconnector connection part ILW1-1 connected to the corresponding interconnector 220b and a junction box connection part ILW1-2 connected to one end portion of the interconnector connection part ILW1-1. Likewise, the second inner lead wire ILW2 includes an interconnector connection part ILW2-1 connected to the corresponding interconnector 220c and a junction box connection part ILW2-2 connected to one end portion of the interconnector connection part ILW2-1.

The interconnector connection part (OLW1-1, OWL-2-1, ILW1-1, and ILW2-1) of each lead wire connected to the interconnectors (2201, 220b, 220c, and 220d) is also called a "bus (bar) ribbon" or a "bus (bar) interconnector".

The interconnector connection parts OLW1-1 and OLW2-1 of the first and second outer lead wires OLW1 and OLW2 are arranged to cross the corresponding interconnectors 220a and 220d, respectively, and the junction box connection parts OLW1-3 and OLW2-3 are arranged to cross the interconnector connection parts OLW1-1 and OLW2-1, namely, arranged to be parallel to the interconnectors 220a and 220d, respectively.

Likewise, the interconnector connection parts ILW1-1 and ILW2-1 of the first and second inner lead wires ILW1 and ILW2 are arranged to cross the corresponding interconnectors 220b and 220c, respectively, and the junction box connection parts ILW1-2 and ILW2-2 are arranged to cross the interconnector connection parts ILW1-1 and ILW2-1, respectively.

Additionally, the interconnector connection part OLW1-1 of the first outer lead wire OLW1 is arranged in a generally straight line with the interconnector connection part ILW1-1 of the first inner lead wire ILW1. Likewise, the interconnector connection part ILW2-1 of the second inner lead wire ILW2 is arranged in a straight line with the interconnector connection part OLW2-1 of the second outer lead wire OLW2.

The interconnector connection part OLW1-1 of the first outer lead wire OLW1, the interconnector connection part ILW1-1 of the first inner lead wire ILW1, the interconnector connection part ILW2-1 of the second inner lead wire ILW2, and the interconnector connection part OLW2-1 of the second outer lead wire OLW2 are generally arranged in a straight line overall.

According to such characteristics, because the interconnector connection part OLW1-1 of the first outer lead wire OLW1 and the interconnector connection part OLW2-1 of the second outer lead wire OLW2 are disposed in a straight line with the interconnection connection part ILW1-1 of the first inner lead wire ILW1 and the interconnector connection part ILW2-1 of the second inner lead wire ILW2, a portion or region of the solar cell panel 200 that is not used for producing energy, i.e., a portion in which the lead wires LW are disposed, can be reduced compared to the related art in which the interconnector connection parts are disposed beside each other.

The coupling part OLW1-2 coupling the interconnector connection part OLW1-1 of the first outer lead wire OLW1 and the junction box connection part OLW1-3 includes a first coupling part OLW1-2-1 coupled to an end portion of the interconnector connection part OLW1-1 such that it crosses the interconnector connection part OLW1-1 and a second coupling part OLW1-2-2 coupled to the first coupling part OLW1-2-1 and the junction box connection part OLW1-3 such that it is parallel to the interconnector connection part OLW1-1. With such a configuration, the first outer lead wire OLW1 is arranged in a stepwise manner.

Particularly, in the stepwise arrangement, an end portion of the interconnector connection part OLW1-1 of the first outer lead wire OLW1 is positioned under an end portion of the first coupling part OLW1-2-1, and an end portion of the junction box connection part OLW1-3 is positioned under an end portion of the second coupling part OLW1-2-2. In some implementations, one or more of the interconnector connection part OLW1-1 of the first outer lead wire OLW1, the first coupling part OLW1-2-1, the second coupling part OLW1-2-2 and the junction box connection part OLW1-3 can be formed as a unitary member and the portions thereof corresponding to such parts can be formed by bends, joints, or other transitions of the unitary member.

Likewise, the coupling part OLW2-2 coupling the interconnector connection part OLW2-1 of the second outer lead wire OLW2 and the junction box connection part OLW2-3 includes a first coupling part OLW2-2-1 coupled to an end portion of the interconnector connection part OLW2-1 such that it crosses the interconnector connection part OLW2-1 and a second coupling part OLW2-2-2 coupled to the first coupling part OLW2-2-1 and the junction box connection part OLW2-3 such that it is parallel to the interconnector connection part OLW2-1. With such a configuration, the second outer lead wire OLW2 is arranged in a stepwise manner.

In this arrangement, an end portion of the interconnector connection part OLW2-1 of the second outer lead wire OLW2 is positioned under an end portion of the first coupling part OLW2-2-1, and an end portion of the junction box connection part OLW2-3 is positioned under an end portion of the second coupling part OLW2-2-2. In some implementations, one or more of the interconnector connection part OLW2-1 of the second outer lead wire OLW2, the first coupling part OLW2-2-1, the second coupling part OLW2-2-2 and the junction box connection part OLW2-3 can be formed as a unitary member and the portions thereof corresponding to such parts can be formed by bends, joints, or other transitions of the unitary member.

With respect to the inner lead wires ILW1 and ILW2, the interconnector connection parts ILW1-1 and ILW2-1 are positioned under the junction box connection parts ILW1-2 and ILW2-2.

With such an arrangement of the lead wires LW, although the lead wires are divided into several sections, steps required for producing the solar cell panel 200 can be reduced.

According to the foregoing structure, the first outer lead wire OLW1 does not overlap with the first inner lead wire ILW1, and the second outer lead wire OLW2 does not overlap with the second inner lead wire ILW2. Also, there is no connection between the outer lead wires OLW1 and OLW2 and the inner lead wires ILW1 and ILW2 that would interfere with conduction of charge carriers within each of the lead wires. Additionally, because the lead wires do not overlap, there is no need to include an insulating film between the outer lead wires OLW1 and OLW2 and the inner lead wires ILW1 and ILW2.

In the design described by the related art, in which the interconnector connection parts OLW1-1 and OLW2-1 of the outer lead wires OLW1 and OLW2 and the interconnector connection parts ILW1-1 and ILW2-1 of the inner lead wires ILW1 and ILW2 are disposed beside each other, an insulating film would need to be disposed between the outer lead wires OLW1 and OLW2 and the inner lead wires ILW1 and ILW2 in order to prevent the coupling parts OLW1-2 and OLW2-2 of the outer lead wires OLW1 and OLW2 from contacting the interconnector connection parts ILW1-1 and ILW2-1 of the inner lead wires ILW1 and ILW2 at an overlapping portion.

Thus, when the interconnector connection parts OLW1-1 and OLW2-1 of the outer lead wires OLW1 and OLW2 and the interconnector connection parts ILW1-1 and ILW2-1 of the inner lead wires ILW1 and ILW2 are arranged in a generally straight line and the outer lead wires OLW1 and OLW2 are arranged in the stepwise configuration, there is no need to include an insulating film or other electrical insulating material for insulating the outer lead wires OLW1 and OLW2 and the inner lead wires ILW1 and ILW2 from one another, so the manufacturing cost and the number of manufacturing processes for the solar cell panel 200 can be reduced.

Meanwhile, an insulating film 260 used to insulate the outer lead wires OLW1 and OLW2 and the inner lead wires ILW1 and ILW2 from the solar cells 210 and the interconnectors is formed to have a size sufficient for covering the entirety of the coupling parts OLW1-2 and OLW2-2 of the outer lead wires OLW1 and OLW2, a portion of the junction box connection parts OLW1-3 and OLW2-3, and a portion of the junction box connection parts ILW1-2 and ILW2-2 of the inner lead wires ILW1 and ILW2. The insulating film 260 is positioned on the rear surface of the solar cell 210 and in the spaces between the lead wires OLW1, OLW2, ILW1 and ILW2.

In this case, the insulating film 260 is made of an opaque material which is similar to or the same as that of the back sheet 250. Because the material of the insulating film 260 is opaque, only the interconnector connection parts OLW1-1, OLW2-1, ILW1-1, and ILW2-1 of the lead wires OLW1, OLW2, ILW1, and ILW2 are seen at the back side of the solar cell module 100, so the external appearance and insulation characteristics can be improved. Additionally, because the lead wires do not extend beyond the interconnector connection parts OLW1-1, OLW-2-1, ILW-1-1, and ILW-2-1, only the interconnector connection parts OLW1-1, OLW2-1, ILW1-1, and ILW2-1 of the lead wires OLW1, OLW2, ILW1, and ILW2 are seen at the front back side of the solar cell module 100.

In the foregoing examples, the interconnector connection parts OLW1-1 and OLW2-1, the first coupling parts OLW1-2-1 and OLW2-2-1, the second coupling parts OLW1-2-2 and OLW2-2-2, and the junction box connection parts OLW1-3 and OLW2-3 of the outer lead wires OLW1 and OLW2 are described as being divided (i.e., separate wires). Likewise, the interconnector connection parts ILW1-1 and ILW2-1 and the junction box connection parts ILW1-2 and ILW2-2 of the inner lead wires ILW1 and ILW2 are described as being divided (i.e., separate wires).

However, the design of solar cell module 100 is not limited thereto and the lead wires OLW1, OLW2, ILW1, and ILW2 may be integrally formed.

Such a design of the lead wires will now be described with reference to FIG. 6, which is an enlarged view of lead wires according to a modification of the lead wires of FIG. 3. As illustrated, the outer lead wires OLW1 and OLW2 are each configured as a single body, respectively, and each body includes interconnector connection parts OWL1-1 and OLW2-2, first coupling parts OLW1-2-1 and OLW2-2-1, second coupling parts OLW1-2-2 and OLW2-2-2, and junction box connection parts OLW1-3 and OLW2-3. Likewise, the inner lead wires ILW1 and ILW2 are each configured as a single body, respectively, and each body includes interconnector connection parts ILW1-1 and ILW2-1 and junction box connection parts ILW1-2 and ILW2-2.

The outer lead wires OLW1 and OLW2 and the inner lead wires ILW1 and ILW2 may be configured as a single body, respectively. Alternatively, although not shown, at least one of the interconnector connection parts OLW1-1 and OLW2-1, the first coupling parts OLW1-2-1 and OLW2-2-1, the second coupling parts OLW1-2-2 and OLW2-2-2, and the junction box connection parts OLW1-3 and OLW2-3 of the outer lead wires OLW1 and OLW2 may be formed as a separate member from the other parts.

Figure 6:
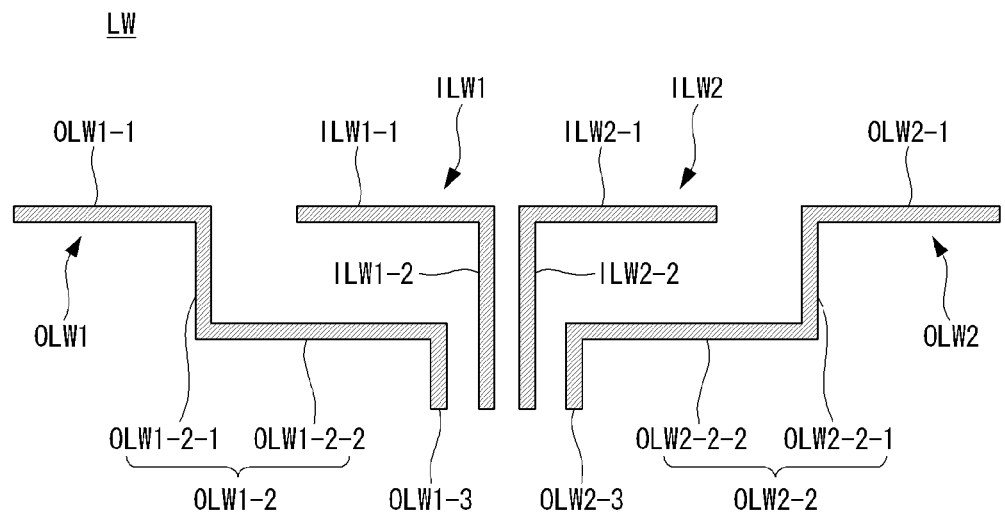
FIG. 6 is an enlarged view of lead wires according to a modification of FIG. 3.
Figure 7:
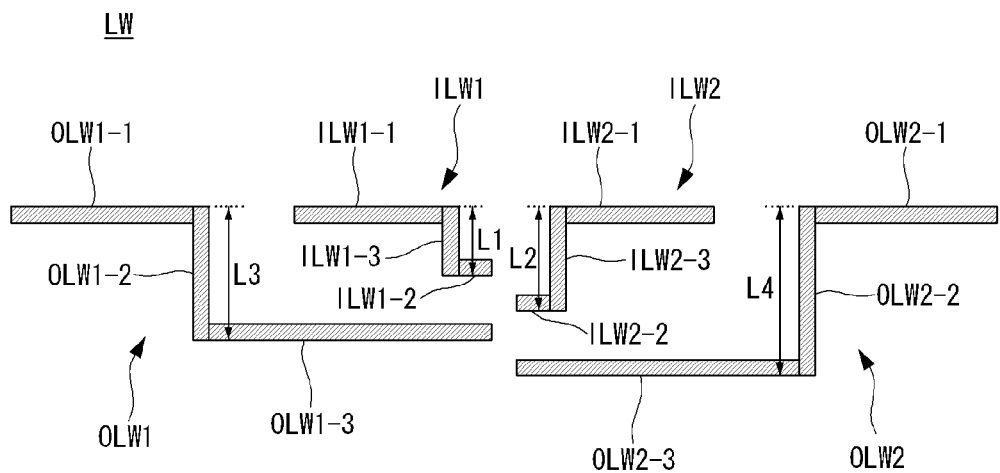
FIG. 7 is an enlarged view of lead wires according to another modification of FIG. 3.

Additionally, the lead wires may be configured to have a form different from those of the embodiments illustrated in FIGS. 3 and 6. This will now be described with reference to FIG. 7. FIG. 7 is an enlarged view of lead wires according to another modification of the lead wires of FIG. 3. As illustrated, the modification illustrated in FIG. 7 may be used when connection parts of the junction box 400 (shown in FIGS. 1 and 3) are disposed in a direction of the strings of the solar cell panel 200, which is different in the structure of the lead wires from those of the implementations described above, which are used when the connection parts of the junction box connected to the lead wires are disposed in a direction across the strings of the solar cell panel.

In detail, with regard to FIG. 7, the junction box connection parts OLW1-3 and OLW2-3 and the interconnector connection parts OLW1-1 and OLW2-1 of the outer lead wires OLW1 and OLW2 are arranged to be parallel such that they cross the interconnectors, and the coupling parts OLW1-2 and OLW2-2 coupling the interconnector connection parts OLW1-1 and OLW2-1 and the junction box connection parts OLW1-3 and OLW2-3 are linearly formed to be arranged to be parallel to the interconnectors.

The junction box connection parts ILW1-2 and ILW2-2 and the interconnector connection parts ILW1-1 and ILW2-1 of the inner lead wires ILW1 and ILW2 are arranged to be parallel to each other such that they cross the interconnectors, and the coupling parts ILW1-3 and ILW2-3 coupling the interconnector connection parts ILW1-1 and ILW2-1 and the junction box connection parts ILW1-2 and ILW2-2 are arranged to be parallel to the interconnectors.

As shown in FIG. 7, a length L1 of the coupling part ILW1-3 of the first inner lead wire ILW1 and a length L2 of the coupling part ILW2-3 of the second inner lead wire ILW2 in direction of the strings may be different, and also a length L3 of the coupling part OLW1-2 of the first outer lead wire OLW1 and a length L4 of the coupling part OLW2-2 of the second outer lead wire OLW2 in the direction of the strings may be different.

In FIG. 7, it is illustrated such that the length L1 of the coupling part ILW1-3 of the first inner lead wire ILW1 and the length L3 of the coupling part OLW1-2 of the first outer lead wire OLW1 are shorter than the length L2 of the coupling part ILW2-3 of the second inner lead wire ILW2 and the length L4 of the coupling part OLW2-2 of the second outer lead wire OLW2. However, the length L1 of the coupling part ILW1-3 of the first inner lead wire ILW1 and the length L3 of the coupling part OLW1-2 of the first outer lead wire OLW1 may be longer than the length L2 of the coupling part ILW2-3 of the second inner lead wire ILW2 and the length L4 of the coupling part OLW2-2 of the second outer lead wire OLW2.

As for the lead wires having such configurations, similar to the implementations described above, at least one of the parts may be formed to be separated from the other parts or all of the parts may be integrally formed as a single body.

Figure 8:
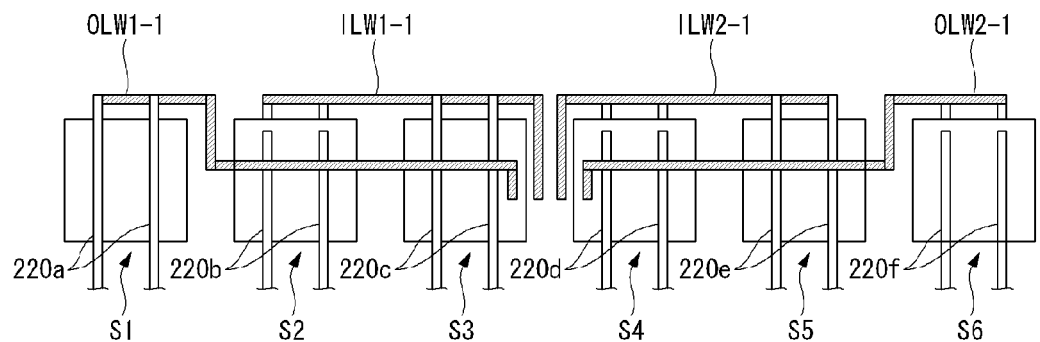
FIG. 8 is a rear view of another solar cell module having lead wires.

FIG. 8 is a rear view of a solar cell module having lead wires according to another implementation of a solar cell module. A solar cell module according to the implementation of FIG. 8 includes six strings, namely, first to sixth strings S1, S2, S3, S4, S5, and S6. Thus, the first and sixth strings S1 and S6 are outer strings, and the second to fifth strings S2, S3, S4, and S5 are inner strings.

The lead wires used for the solar cell module having the configuration of FIG. 8 are configured to have an overall shape and structure similar to those of the lead wires according to the implementation of FIGS. 3, 4, and 6, and are different in that the interconnector connection part ILW1-1 of the first inner lead wire ILW1 is formed having a length sufficient to connect with both the interconnector 220b of the second string S2 and the interconnector 220c of the third string S3. Likewise, the interconnector connection part ILW2-1 of the second inner lead wire ILW2 is formed having a length sufficient to connect with both the interconnectors 220d and 220e of the fourth and fifth strings S4 and S5. Reference numerals OLW1-1 and OLW2-1 in FIG. 8 denote interconnector connection parts of the first and second outer lead wires OLW1 and OLW2, respectively.

In some implementations, the solar cell module can include other numbers of strings of solar cells. For example, the solar cell module can include first to eighth strings. The first and eighth strings constitute outer strings, while the other remaining strings, namely the second to seventh strings constitute inner strings. Accordingly, and as illustrated in FIGS. 9 and 10, in a solar cell module that includes eight strings, the lead wires may include a first outer lead wire OLW1 connected with interconnectors of the first string, a first inner lead wire ILW1 simultaneously connected with interconnectors of the second and third strings, a second inner lead wire ILW2 connected with interconnectors of the fourth string, a third inner lead wire ILW3 connected with interconnectors of the fifth string, a fourth inner lead wire ILW4 connected with interconnectors of the sixth and seventh strings, and a second outer lead wire OLW2 connected with interconnectors of the eighth string.

Figure 9:
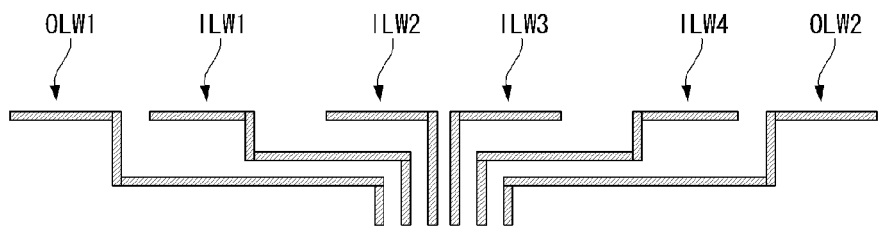
FIG. 9 is an enlarged view of another design of lead wires of the solar cell panel.
Figure 10:
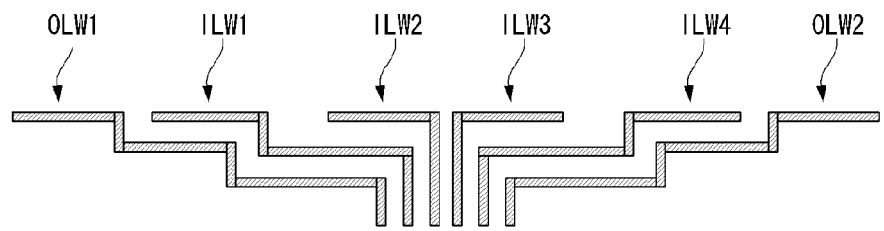
FIG. 10 is an enlarged view of lead wires according to a modification of FIG. 9.

The first outer lead wire OLW1 connected with the interconnectors of the first string, and the second outer lead wire OLW2 connected with the interconnectors of the eighth string may be formed to have the same structure as that of the first inner lead wire ILW1 simultaneously connecting the interconnectors of the second and third strings and the fourth inner lead wire ILW4 simultaneously connecting the interconnectors of the sixth and seventh strings as shown in FIG. 9, or may be formed to have such a structure as illustrated in FIG. 10.

In this manner, the lead wires may be arranged in one of a number of various different configurations such that they do not overlap with each other. Thus, the need for an insulating material to be included between overlapping portions of the lead wires can be avoided. As also described above, the configuration of the lead wires can be selected such that the lead wires do not extend beyond the interconnector connecting parts.

Although to the foregoing disclosure includes a number of illustrative implementations, it should be understood that numerous other modifications and variations are possible that will fall within the scope of the principles of this disclosure. More particularly, variations and modifications are possible in the number of component parts, the materials thereof, the manner of producing and/or assembling the component parts, and/or the arrangements of the component parts.

What is claimed is:
1. A solar cell module comprising:
 a solar cell panel including two outer strings and one or more inner strings positioned between the outer strings;
 a plurality of interconnectors electrically connecting the plurality of solar cells of the strings;
 a plurality of lead wires electrically coupling a junction box to the interconnectors; and
 an insulating layer insulating the plurality of lead wires from the solar cells and the plurality of interconnectors,
 wherein the plurality of lead wires are arranged such that they do not overlap with each other,
 wherein two outer lead wires that is connected to the interconnector of a respective outer string include an interconnector connection part connected to the interconnector of a respective outer string and a first coupling part coupled to the interconnector connection part,
 wherein a width of the insulating layer is equal to or larger than a distance between the first coupling parts of the two outer lead wires.
2. The solar cell module of claim 1, wherein the plurality of lead wires further include one or more inner lead wires that is connected to the interconnector of a respective inner string,
 wherein the inner lead wire includes an interconnector connection part that is connected to the interconnector of a respective inner string, wherein the interconnector connection parts of the respective lead wires are arranged in a straight line.

3. The solar cell module of claim 2, wherein the outer lead wire further includes a second coupling part coupled to the first coupling part and a junction box connection part coupled to the second coupling part.

4. The solar cell module of claim 3, wherein the interconnector connection part and the second coupling part of the outer lead wire are arranged parallel to each other, and the first coupling part and the junction box connection part of the outer lead wire are arranged orthogonal to the interconnector connection part and the second coupling part of the outer lead wire.

5. The solar cell module of claim 3, wherein a length of the insulating layer is equal to or larger than a distance between the junction box connection part and the interconnector connection part of the outer lead wire.

6. The solar cell module of claim 3, wherein the interconnector connection part, the first coupling part, the second coupling part and the junction box connection part of the outer lead wire are integrally formed.

7. The solar cell module of claim 3, wherein at least one of the interconnector connection part, the first coupling part, the second coupling part and the junction box connection part of the outer lead wire are formed to be separated from the other parts.

8. The solar cell module of claim 7, wherein an end portion of the interconnector connection part of the outer lead wire is positioned at a lower side of an end portion of the first coupling part, and an end portion of the junction box connection part is positioned at a lower side of an end portion of the second coupling part.

9. The solar cell module of claim 2, wherein the outer lead wire further includes a junction box connection part coupled to the first coupling part.

10. The solar cell module of claim 9, wherein the interconnector connection part and the junction box connection part of the outer lead wire are arranged parallel to each other and the first coupling part of the outer lead wire is arranged orthogonal to the interconnector connection part and the junction box connection part of the outer lead wire.

11. The solar cell module of claim 9, wherein the interconnector connection part, the first coupling part and the junction box connection part of the outer lead wire are integrally formed.

12. The solar cell module of claim 9, wherein at least one of the interconnector connection part, the first coupling part and the junction box connection part of the outer lead wire are formed to be separated from the other parts.

13. The solar cell module of claim 12, wherein an end portion of the interconnector connection part of the outer lead wire is positioned at a lower side of one end portion of the first coupling part, and an end portion of the junction box connection part is positioned at a lower side of another end portion of the first coupling part.

14. The solar cell module of claim 2, wherein the inner lead wire further includes a junction box connection part being coupled to the interconnector connection part that is connected to the interconnector of the inner string.

15. The solar cell module of claim 14, wherein the interconnector connection part and the junction box connection part of the inner lead wire are integrally formed.

16. The solar cell module of claim 14, wherein the interconnector connection part and the junction box connection part of the inner lead wire are formed to be separated from each other, and an end portion of the interconnector connection part of the inner lead wire is positioned at a lower side of an end portion of the junction box connection part of the inner lead wire.

17. The solar cell module of claim 2, wherein the inner lead wire further includes a third coupling part being coupled to the interconnector connection part of the inner string and a junction box connection part being coupled to the third coupling part, the third coupling part being arranged orthogonal to the interconnector connection part of the inner string and the junction box connection part being arranged orthogonal to the third coupling part.

18. The solar cell module of claim 17, wherein the interconnector connection part, the third coupling part and the junction box connection part of the inner lead wire are integrally formed.

19. The solar cell module of claim 17, wherein at least one of the interconnector connection part, the third coupling part and the junction box connection part of the inner lead wire are formed to be separated from the other parts.

20. The solar cell module of claim 19, wherein an end portion of the interconnector connection part of the inner lead wire is positioned at a lower side of one end portion of the third coupling part, and an end portion of the junction box connection part is positioned at a lower side of another end portion of the third coupling part.

* * * * *